United States Patent [19]
Crampton

[11] Patent Number: 5,767,721
[45] Date of Patent: Jun. 16, 1998

[54] SWITCH CIRCUIT FOR FET DEVICES HAVING NEGATIVE THRESHOLD VOLTAGES WHICH UTILIZE A POSITIVE VOLTAGE ONLY

[75] Inventor: Raymond J. Crampton, Blacksburg, Va.

[73] Assignee: ITT Industries, Inc., White Plains, N.Y.

[21] Appl. No.: 655,340

[22] Filed: Jun. 6, 1996

[51] Int. Cl.⁶ .................................................. H01P 1/22
[52] U.S. Cl. .......................... 328/308; 327/328; 331/81 R
[58] Field of Search ................................ 327/308–310, 327/315, 319, 321, 328, 331; 333/81 R

[56] References Cited

U.S. PATENT DOCUMENTS

| | | | |
|---|---|---|---|
| 4,787,686 | 11/1988 | Tajima et al. | 327/308 |
| 4,890,077 | 12/1989 | Sun | 327/328 |
| 4,978,932 | 12/1990 | Gupta et al. | 333/81 R |
| 5,345,123 | 9/1994 | Staudinger et al. | 327/308 |

FOREIGN PATENT DOCUMENTS 52-39349  3/1977  Japan ................................. 327/308

*Primary Examiner*—Timothy P. Callahan
*Assistant Examiner*—T. T. Lam
*Attorney, Agent, or Firm*—Plevy & Associates

[57] ABSTRACT

A switch circuit is disclosed including a first FET device coupled in series with an input terminal and an output terminal. A second FET device coupled to the first device in a shunt configuration. The FET devices operative in a first mode to enable electronic signal transmission between the input and output terminals, and further operative in a second mode to prevent the electronic signal transmission. A biasing network for enabling a single control signal to operate the FET devices in both the first and second modes.

19 Claims, 2 Drawing Sheets

SWITCH CIRCUIT FOR FET DEVICES HAVING NEGATIVE THRESHOLD VOLTAGES WHICH UTILIZE A POSITIVE VOLTAGE ONLY

BACKGROUND OF THE INVENTION

1. Field of the Invention

The present invention relates generally to switch and attenuator circuits and more particularly, to a switch circuit utilizing semiconductor devices having negative threshold voltages which are controlled by a positive voltage only.

2. Description of the Prior Art

A Field Effect Transistor (FET) is a type of semiconductor device which is utilized in a wide variety of electronic circuit applications. An example of a FET device is shown in FIG. 1, which typically includes a drain terminal 12, a source terminal 14 and a gate terminal 16. Disposed between the drain 12 and source 14 is a channel, which is the portion of the FET 10 that actually conducts current when the device 10 is turned on. The channel is fabricated from either n-type or p-type material, which determines whether the device 10 is n-type or p-type. The gate 16 is the control input of the device 10, which is utilized to control the current flow in the channel.

In order to turn on the FET device 10, the gate 16 must be charged to some potential with respect to the source. The minimal potential required to turn on an FET device is known as the "Threshold Voltage", which typically has a magnitude of less than a volt. Depending on the type of device, the threshold voltage is either positive or negative. For example, a n-type enhancement mode FET device has a positive threshold voltage, while for a n-type depletion mode FET it is negative.

N-type FET devices are inherently quicker than P-type devices due to the appreciably greater mobility of electrons in silicon as compared to holes. Thus, n-type FET devices are especially well suited to be utilized in circuit applications which require these devices to be switched on and off at a high frequency. Such circuit applications include switches, variable attenuators, digital attenuators and other circuits which utilize FETs as control devices. Also, in many GaAs circuit applications n-type FETs are utilized in order to implement the primary circuit function.

An example of a switch circuit that utilizes enhancement mode FETs is shown in FIG. 2. The use of enhancement mode FETs enables this circuit 18 to incorporate a positive control voltage. The circuit 18 includes a series pass element 28 which is an enhancement mode FET device coupled between an input terminal 22 and an output terminal 34. Coupled between each terminal 22,34 and the series pass element 28 are coupling capacitors 24,32 which are utilized to block DC voltages. The drain terminal and source terminal of the series pass element 28 are both coupled to ground by a pair of biasing resistors 26,30 which also have large resistive values. A first control voltage $V_1$ is coupled to the gate of the series pass element 28 by a first gate resistor 36, which also has a large value.

Further coupled to the source of the series pass element 28 is the drain of a shunt element 38 which is also an enhancement mode FET device. The source of this device 38 is coupled to ground, while a second control voltage $V_2$ is coupled to the gate of the device 38 by a second gate resistor 40. The second gate resistor also has a large resistive value. The enhancement mode devices 28,38 included in the circuit 18 are turned on by a positive gate-source voltage and turned off when the gate-source voltage drops to zero volts.

During operation, $V_1$ rises from 0 to a positive voltage while $V_2$ drops from a positive voltage to 0. This causes the series pass element 28 to be turned on and the shunt element 38 to be turned off. The series pass element 28 being turned on corresponds to the "on" state of the circuit, which enables a signal to be transmitted from the input terminal 22 to the output terminal 34. After the signal is transmitted through the circuit 18, $V_2$ rises from 0 to a positive voltage while $V_1$ drops from a positive voltage to 0. This causes the series pass element 28 to be turned off and the shunt element 38 to be turned on corresponding to the "off" state of the circuit 18. In the "off" state the series pass element 28 blocks any signal from being transmitted between the terminals 22,34, while the shunt element 38 shorts any noise or other type of residual signal to ground.

Another example of a switch circuit is shown in FIG. 3. This circuit 40 is similar to the previously described circuit except that it utilizes depletion mode FETs as the series pass element 29 and the shunt element 39. As previously discussed, depletion mode FETs have a negative threshold voltage, which means these type of devices are turned on with a gate-source voltage of zero volts or higher.

In order for this circuit 40 to utilize a positive control voltage, the drain and source terminals of the depletion mode devices 29,39 must be biased high enough so that 0 volts at the gate turns these devices off. This is accomplished by coupling the drain and source of the series pass element 29 to a positive voltage $V_+$ through the bias resistors 26,28, and coupling the source of the shunt element 39 to the positive voltage $V_+$ through an additional bias resistor 42. Resistors 26,28 and 42 have large resistive values. An additional coupling capacitor 44 is also coupled to the source of the shunt element 39. This capacitor 44 is also of a large value for blocking DC signals from other interfacing circuits.

During operation, this circuit 40 operates similarly as the circuit of FIG. 2. Still Referring to FIG. 3, when $V_1$ rises from 0 to a positive voltage while $V_2$ drops from a positive voltage to 0, the circuit 40 enters the "on" state, where the series pass element 29 allows a signal to be transmitted from the input terminal 22 to the output terminal 34. When $V_2$ rises from 0 to a positive voltage while $V_1$ drops from a positive voltage to 0, the circuit enters the "off" state where the series pass element 29 blocks any signal from being transmitted between the terminals 22,34, while the shunt element 39 shorts any noise or other type of residual signal to ground.

The circuits of FIGS. 2 & 3 both enable the use of positive control voltages as previously described. However, these circuits also require two different control voltages $V_1$ & $V_2$. In order to produce the two control voltages, an inverter circuit is required as shown in FIG. 4. The inverter circuit 46 includes an enhancement mode FET 50 which is utilized because the first control voltage $V_1$ is positive. The gate of the device 50 is coupled to $V_1$ through a gate resistor 52 having a large value. The resistors 48,54 coupled to the drain and source of the device 50 are chosen to shape the transfer curve of the output voltage $V_2$ with respect to control voltage $V_1$.

This circuit 46 operates in conjunction with the previously described switch circuits, wherein $V_1$ & $V_2$ of this circuit 46 serve as the control voltages for the switch circuits. During operation, $V_1$ rises from 0 to some positive voltage, which turns on the FET device 50. This causes the output voltage $V_2$ to be driven from a positive voltage to 0 volts. When $V_1$ falls to 0 volts again, the FET device 50 turns off, again driving $V_2$ to a positive voltage which is the supply voltage $V_+$.

The switch circuits of FIGS. 2 & 3 both require the use of enhancement mode FET devices due to the use of the voltage inverter. The use of such devices is a significant disadvantage since many GaAs circuits use depletion mode devices for the primary functions. Adding enhancement mode devices causes an increase in fabrication cost and decrease in the circuit yield. These considerations have required the use of negative control voltages or two control voltages in many previous circuits.

It is therefore, an object of the present invention to provide a biasing scheme that enables a depletion mode FET device which has a negative threshold voltage to be utilized in a switch circuit having a single positive control voltage only.

SUMMARY OF THE INVENTION

A switch circuit including a first FET device coupled in series with an input terminal and an output terminal. A second FET device is coupled to the first device in a shunt configuration. The FET devices operative in a first mode to enable electronic signal transmission between the input and output terminals, and further operative in a second mode to prevent the electronic signal transmission. A biasing means for enabling a single control signal to operate the FET devices in both the first and second modes.

The first mode includes simultaneously turning on the first device and turning off the second device, while the second mode includes simultaneously turning off the first device and turning on the second device.

BRIEF DESCRIPTION OF THE DRAWING

The above objects, further features and advantages of the present invention are described in detail below in conjunction with the drawings, of which.

DETAILED DESCRIPTION OF THE DRAWING

The present invention is directed to a biasing scheme that enables semiconductor devices which have negative threshold voltages, such as depletion mode FETs, to be controlled in a switch circuit by a single positive control voltage. Utilizing a single control voltage is desirable because it eliminates the use of inverter circuits which require enhancement mode FETs as described in the prior art. By not utilizing enhancement mode devices, the circuit according to the present invention decreases fabrication costs and increases yields.

Figure 1:
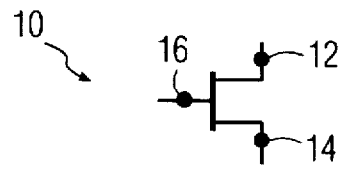
FIG. 1 is an example of a FET device.
Figure 2:
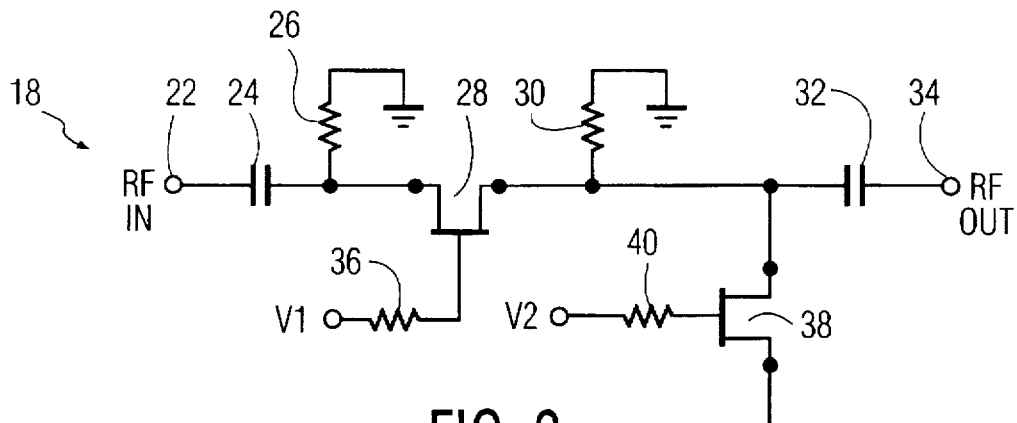
FIG. 2 is a schematic diagram of a prior art switch circuit.
Figure 3:
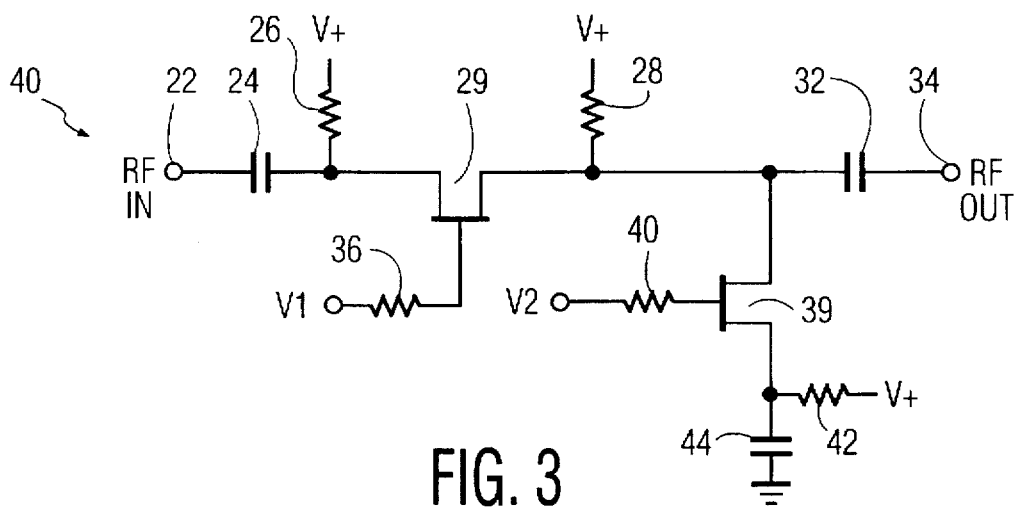
FIG. 3 is a is a schematic diagram of another prior art switch circuit.
Figure 4:
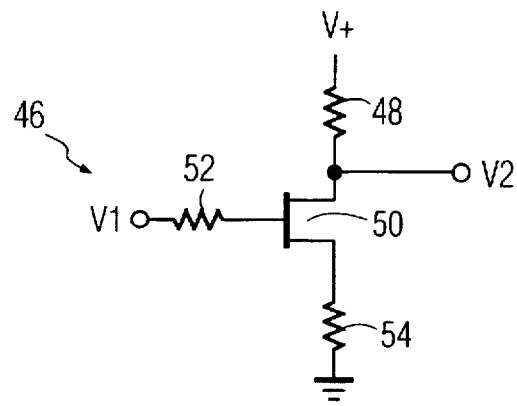
FIG. 4 is a schematic diagram of a prior art voltage inverter circuit.
Figure 5:
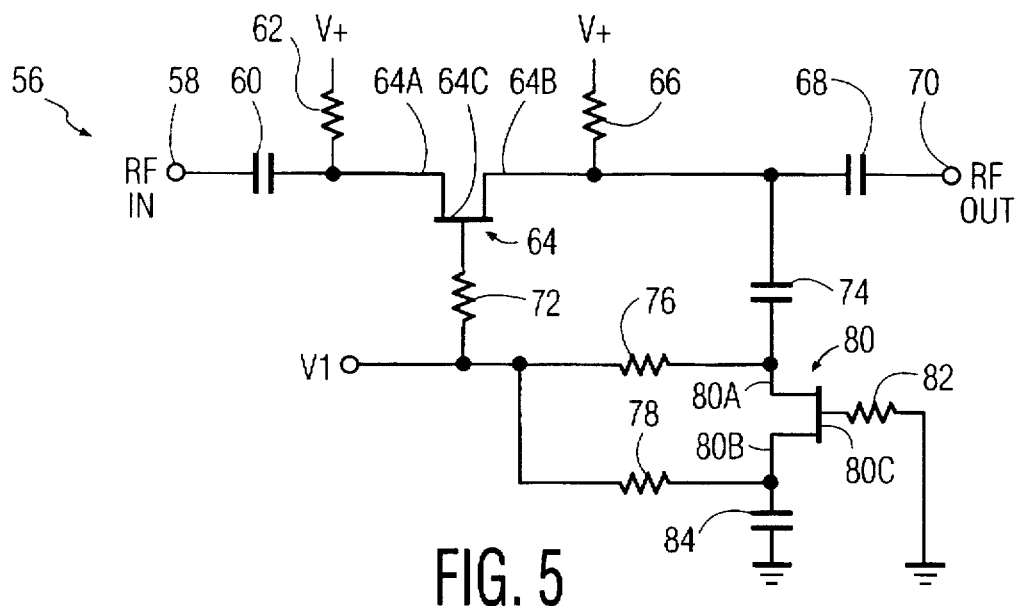
FIG. 5 is a is a schematic diagram of a switch circuit according to the present invention.

Referring to FIG. 5, there is shown a schematic diagram of the switch circuit according to the present invention. This circuit 56 utilizes depletion mode FET devices 64,80 as both the series pass element and shunt element. The biasing scheme of the present invention enables a single positive control voltage $V_1$ to simultaneously control both depletion mode devices 64,80. The biasing scheme includes biasing both the drain 64A and source 64B of the series pass element 64 to a predetermined positive potential, and further biasing the gate 80C of the shunt element 80 to a zero or ground potential.

The circuit 56 includes a first depletion mode FET device 64 which is coupled between an input terminal 58 and an output terminal 70. The first device is utilized to allow signals to be transferred between the terminals 58,70 when turned on and block such transmission when turned off. Coupled between each terminal 58,70 and the first device 64 are coupling capacitors 60,68 which block DC voltages, yet have a sufficiently large capacitance to pass AC signals without attenuation. The drain 64A and source terminal of the first device 64B are both coupled to a predetermined positive potential $V_+$ by a first pair of biasing resistors 62,66. The gate terminal of the first device 64C is coupled to the control voltage $V_1$ by a gate resistor 72. Biasing the first device 64 in this manner enables it be turned off when $V_1$ is at a zero potential.

The circuit 56 further includes a second depletion mode FET device 80 which is coupled to the first device 64 in a shunt configuration. In particular, the drain of the second device 80A is coupled to the source of the first device 64B through a third coupling capacitor 74 which is also utilized to block DC signals. The source terminal of the second device 80B is coupled to ground by a fourth coupling capacitor 84. The gate of the second device 80C is also coupled to ground by a second gate resistor 82.

The drain 80A and source of the second device 80B are further coupled to the control voltage $V_1$ by a second pair of biasing resistors 76,78. Biasing the second device 80 in this manner enables it to be turned on when $V_1$ is at a zero voltage and turned off when $V_+$ is at a significant positive voltage. The resistors 62,66,72,76,78,82 included in the circuit 56 each have a large resistance value of at least 50 Kilohms.

During operation, the circuit 56 operates in two different states or modes. In the first mode, the control voltage $V_1$ is at zero potential which causes the first device 64 to be turned off, while simultaneously turning on the second device 80. The first device 64 being turned off blocks any signal from being transmitted between the terminals 58,70, while the second device 80 being turned on shorts any noise or residual signals to ground.

In the second state, the control voltage $V_1$ transitions from a zero to a positive potential. This causes the first device 64 to be turned on, while simultaneously turning off the second device 80. The first device 64 being turned on and the second device 80 being turned off enables a signal to be transmitted between the input and output terminals 58,70. The biasing scheme of the present invention enables the depletion mode devices 64,80 in both states to be alternately turned on and off by a single control voltage $V_1$. This eliminates the need to provide two control voltages, which as described in the prior art can be generated by an additional inverter circuit. As previously discussed, including such an inverter circuit is undesirable in GaAs circuit applications. Fabrication costs and yields of these type of circuits are adversely affected when an inverter is included. Without an inverter circuit, the switch circuit requires two control voltages, thus further complicating use of the circuit.

The circuit configuration of the present invention is capable of being utilized to achieve positive control voltages with any depletion mode device such as a MESFET or JFET device. This configuration is applicable to other types of circuits such as switches, variable attenuators, digital attenuators and any other circuit utilizing depletion mode devices as control elements.

While the invention has been particularly shown and described with reference to preferred embodiments thereof, it will be understood by those skilled in the art that changes in form and details may be made therein without departing from the spirit and scope of the present invention.

What is claimed is:

1. A switch circuit of the type including a series FET device having a drain coupled to both an input terminal and a first predetermined potential, said series FET device also having a source coupled to both an output terminal and said first predetermined potential, a shunt FET device having a drain also coupled to said output terminal, the improvement herewith comprises:
   a gate resistor for coupling a gate of said shunt FET device to a second predetermined potential;
   a first biasing resistor, and a second biasing resistor, wherein said first and second biasing resistors a drain and a source of said shunt FET device to a control potential respectively; and
   a second gate resistor for coupling a gate of said series FET device to said control potential, wherein said control potential is operative in a first mode to simultaneously turn on said series FET device and turn off said shunt FET device, said control potential further operative in a second mode to simultaneously turn off said series FET device and turn on said shunt FET device.

2. The circuit of claim 1, wherein said series FET device and said shunt FET device are both depletion mode devices having a negative threshold voltage.

3. The circuit of claim 1, wherein said source and drain of said series FET device are coupled to said first predetermined potential by a second pair of biasing resistors.

4. The circuit of claim 1, wherein said first predetermined potential is a positive potential.

5. The circuit of claim 1, wherein said second predetermined potential is a ground potential.

6. The circuit of claim 1, wherein said control potential is a positive potential in said first mode and a ground potential in said second mode.

7. The circuit of claim 1, wherein said input terminal is coupled to said series FET device by a first capacitor and said output terminal is coupled to said series FET device by a second capacitor.

8. The circuit of claim 1, wherein said shunt FET device is coupled to said output terminal by a third capacitor and said source of said shunt FET is coupled to a ground potential by a fourth capacitor.

9. A switch circuit, comprising:
   a first FET device coupled in series with an input terminal and an output terminal;
   a second FET device coupled to said first device in a shunt configuration;
   said first FET device and said second FET device operative in a first mode to enable electronic signal transmission between said input and output terminals, and operative in a second mode to prevent said electronic signal transmission; and
   a biasing means for enabling a single control signal to operate said first FET device and said second FET device in both said first and second modes, wherein said biasing means includes a first gate resistor for coupling a gate of said second FET device to a first predetermined potential.

10. The circuit of claim 9, wherein said first FET device and said second FET device are both depletion mode devices having a negative threshold voltage.

11. The circuit of claim 9, wherein said control signal is a positive potential in said first mode and a ground potential in said second mode.

12. The circuit of claim 9, wherein said biasing means further includes a first biasing resistor, and a second biasing resistor, wherein said first and second biasing resistors couple both a drain and a source of said first FE device to a second predetermined potential, respectively.

13. The circuit of claim 12, wherein said second predetermined potential is a positive potential.

14. The circuit of claim 9, wherein said first predetermined potential is a ground potential.

15. The circuit of claim 9, wherein said biasing means further includes a second gate resistor for coupling a gate of said first FET device to said single control signal.

16. The circuit of claim 9, wherein said biasing means further includes a first biasing resistor, and a second biasing resistor, wherein said first and second biasing resistors couple both a drain and a source of said second FET device to said single control signal, respectively.

17. The circuit of claim 9, wherein said first mode includes simultaneously turning on said first FET device and turning off said second FET device.

18. The circuit of claim 9, wherein said second mode includes simultaneously turning off said first FET device and turning on said second FET device.

19. A method of biasing a switch circuit which utilizes a first FET device as a series pass element and a second FET device as a shunt element:
   providing a first biasing resistor, and a second biasing resistor, to couple a drain and a source of said first FET device to a first predetermined potential, respectively;
   providing a first gate resistor to couple a gate of said second FET device to a second predetermined potential;
   providing a second gate resistor to couple a gate of said first FET device to a control potential; and,
   providing a second pair of biasing resistors to couple said control potential to a drain and a source of said second FET device, which enables said control potential to operate in a first mode to simultaneously turn on said first FET device and turn off said second FET device control and further operate in a second mode to simultaneously turn off said first FET device and turn on said second FET device.

* * * * *

UNITED STATES PATENT AND TRADEMARK OFFICE
CERTIFICATE OF CORRECTION

PATENT NO. : 5,767,721

DATED : August 20, 1998

INVENTOR(S) : Crampton

It is certified that error appears in the above-identified patent and that said Letters Patent is hereby corrected as shown below:

In Claim 1, column 5, line 15 after "resistors" and before "a drain" insert --couple--.

In Claim 12, column 6, line 16, that portion reading "FE" should read --FET--.

Signed and Sealed this

Tenth Day of November 1998

*Attest:*

BRUCE LEHMAN

*Attesting Officer*     *Commissioner of Patents and Trademarks*